US006235615B1

United States Patent
Dinh et al.

(10) Patent No.: US 6,235,615 B1
(45) Date of Patent: May 22, 2001

(54) GENERATION OF LOW WORK FUNCTION, STABLE COMPOUND THIN FILMS BY LASER ABLATION

(75) Inventors: Long N. Dinh, Concord; William McLean, II, Oakland; Mehdi Balooch, Berkeley; Edward J. Fehring, Jr., Dublin; Marcus A. Schildbach, Livermore, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/504,302

(22) Filed: Feb. 15, 2000

Related U.S. Application Data

(62) Division of application No. 09/080,096, filed on May 18, 1998, now Pat. No. 6,162,707.

(51) Int. Cl.[7] .............................. H01L 21/20; H01L 21/36
(52) U.S. Cl. .......................... 438/487; 438/20; 438/482; 438/483; 438/484; 438/485; 438/486; 438/767; 438/765; 438/769; 438/770; 438/771; 438/930; 117/904; 117/3
(58) Field of Search .............................. 438/20, 482–487, 438/767, 765, 769, 770, 771, 930; 117/3, 904

(56) References Cited

U.S. PATENT DOCUMENTS

| | | | | |
|---|---|---|---|---|
| 5,726,524 | * | 3/1998 | Debe | 313/309 |
| 5,886,459 | * | 3/1999 | Auciello et al. | 313/310 |
| 6,019,913 | * | 1/2000 | Dinh et al. | 252/516 |

* cited by examiner

Primary Examiner—Jey Tsai
Assistant Examiner—David A Zarneke
(74) Attorney, Agent, or Firm—Alan H. Thompson; L.E. Carnahan

(57) ABSTRACT

Generation of low work function, stable compound thin films by laser ablation. Compound thin films with low work function can be synthesized by simultaneously laser ablating silicon, for example, and thermal evaporating an alkali metal into an oxygen environment. For example, the compound thin film may be composed of Si/Cs/O. The work functions of the thin films can be varied by changing the silicon/alkali metal/oxygen ratio. Low work functions of the compound thin films deposited on silicon substrates were confirmed by ultraviolet photoelectron spectroscopy (UPS). The compound thin films are stable up to 500° C. as measured by x-ray photoelectron spectroscopy (XPS). Tests have established that for certain chemical compositions and annealing temperatures of the compound thin films, negative electron affinity (NEA) was detected. The low work function, stable compound thin films can be utilized in solar cells, field emission flat panel displays, electron guns, and cold cathode electron guns.

9 Claims, 1 Drawing Sheet

GENERATION OF LOW WORK FUNCTION, STABLE COMPOUND THIN FILMS BY LASER ABLATION

This application is a divisional of 09/080,096 filed May 18, 1998 now U.S. Pat. No. 6,162,707.

The United States Government has rights in this invention pursuant to Contract No. W-7405-ENG-48 between the United States Department of Energy and the University of California for the operation of Lawrence Livermore National Laboratory.

BACKGROUND OF THE INVENTION

Display and electronic devices of various types are being widely utilized. A considerable fraction of total power used to drive small electronic devices, such as laptop computers or televisions, is consumed by the video display. Flat panel displays are becoming an integral part of these devices since they are lighter and less bulky compared to conventional cathode ray tubes (CRTs). Liquid crystal displays are commercially available and are mainly used for portable computers. The disadvantages of liquid crystal displays include high energy consumption, high cost of production, low intensity, limited viewing angle, and difficulties associated with large diameter display production.

Among a few alternatives to the active matrix liquid crystal display (AMLCD) is the field emission display. These displays traditionally rely on emission of electrons from arrays of sharp tips. Each tip serves the function of a filament in a traditional CRT by providing a stream of electrons to excite a phosphor on a nearby screen. The ease of electron emissions, and therefore the reduction in energy consumption of the display, depends on the work function of material and sharpness of the tips. These arrays of tips are expensive and difficult to manufacture on small scales and, so far, have been prohibitively expensive for commercial applications. Recently, a process and apparatus has been developed which enables the deposition of low work function material on the field emission tips, and is described and claimed in copending U.S. application Ser. No. 09/080,109, filed May 18, 1998 entitled "Low Work Function Surface Layers Produced by Laser Ablation Using Short-Wavelength Photons," assigned to the same assignee.

Several manufacturers have proposed the use of planar electron emitters in a simple diode geometry to overcome said manufacturing difficulties relative to arrays of sharp electron emission tips. One recent approach to the use of planar electron emitters is described and claimed in copending U.S. application Ser. No. 09/080,110, filed May 18, 1998, now U.S. Pat. No. 6,162,707 entitled "Low Work Function, Stable Compound Clusters and Generation Process," assigned to the same assignee. The production of stable, low work function materials on flat substrates will enable the introduction of this technology, thus, in addition to the compound cluster approach of above-referenced application Ser. No. 09/080,110, the present invention provides for the generation of low work function, stable compound thin films produced by simultaneously laser ablating a silicon target, for example, and thermal evaporating an alkali metal, such as cesium, into an oxygen environment. The compound thin films may be deposited on a substrate, such as silicon, which is patterned to produce a pattern of compound thin films on the substrate. The work functions of the compound thin films (for example, Si/Cs/O films) can be varied by changing the ratio of the components. Tests conducted on the compound thin films have established a low work function and that the films are stable up to 500° C.

SUMMARY OF THE INVENTION

It is an object of the present invention to provide low work function, stable compound thin films.

A further object of the invention is to produce low work function, stable compound thin films using simultaneous laser ablation and thermal evaporation of selected components in an oxygen environment.

A further object of the invention is to provide a process for producing low work function, stable compound thin films on substrates by simultaneously laser ablating a semiconductor material and thermal evaporating an alkali metal into an oxygen environment.

Another object of the invention is to synthesize compound thin films with low work functions by simultaneously laser ablating a material, such as silicon, and thermal evaporating another material, such as cesium, into an oxygen environment.

Another object of the invention is to generate a compound thin film composed of Si/Cs/O, for example, and controlling the work function of the compound thin film by changing the Si/Cs/O ratio.

Another object of the invention is to generate a compound thin film having a low work function and which is stable up to 500° C.

Another object of the invention is to provide a patterned compound thin film on a substrate which can be utilized as planar electron emitters for field emission display devices.

Another object of the invention is to provide an apparatus in which low work function compound thin films can be generated by simultaneous laser ablation and thermal evaporation of selected materials in an oxygen environment.

Other objects and advantages of the present invention will become apparent from the following description and accompanying drawings. Basically, the invention involves the generation of low work function, stable compound thin films on flat substrates for use as planar electron emitters. The production of stable, low work function materials on flat surfaces, which can function as electron emitters, enables the use of planar electron emitters in a simple diode geometry as an alternative to emission of electrons from arrays of sharp tips, for use in field emission displays, such as flat panel displays. The invention involves an apparatus and process whereby simultaneous laser ablation of a semiconductor material, such as silicon, and thermal evaporation of an alkali metal, such as cesium, into an oxygen environment, results in depositing a compound thin film on a substrate. The work functions of the thus formed thin films can be varied by changing the ratio of the semiconductor material, the alkali metal, and the oxygen in the compound thus produced. For example, Si/Cs/O compound thin films have been deposited on silicon substrates, and tests have verified that the thin films have low work function and are stable up to 500° C. Also, tests have verified that for certain compositions and annealing temperatures of the compound thin films, negative electron affinity (NEA) was detected. Thus the compound thin films of this invention overcome the problems associated with arrays of sharp tips for field emissions and will find use in solar cells, field emission flat panel displays, electron guns, and cold cathode electron guns, as well as photocathodes.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
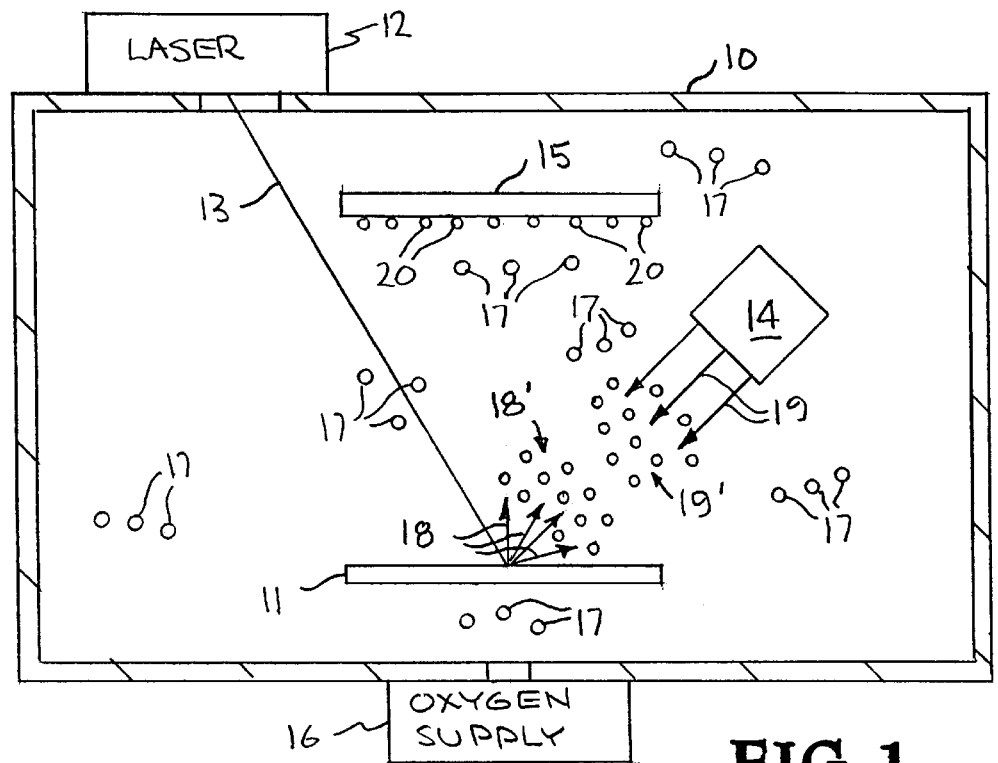
FIG. 1 schematically illustrates an embodiment of an apparatus and the generation process for producing low work function compound thin films on a substrate in accordance with the present invention.

The present invention is directed to the generation of low work function, stable compound thin films. The compound thin films deposited on a substrate provide planar electron emitters, for example, as an alternative to the currently used array of sharp tips for field emission display devices. The compound thin films are synthesized by simultaneously laser ablating a first material, such as silicon, and thermal evaporating a second material, such as cesium, into an oxygen environment. The work functions of the compound thin films can be varied by changing the ratio of the materials forming the films. The process can be utilized to deposit the compound thin films on a patterned substrate. For example, the low work function of compound thin films composed of Si/Cs/O deposited on silicon substrates has been shown to be in the range of 3.5 eV down to 1.7 eV (even down to negative electron affinity), as confirmed by ultraviolet photoelectron spectroscopy (UPS), and these compound thin films were shown to be stable up to 500° C., as measured by x-ray photoelectron spectroscopy (XPS). For certain chemical compositions, such as Cs concentration >10%, and annealing temperatures, such as 300° C., negative electron affinity (NEA) was detected.

While other semiconductor materials and alkali metals may be utilized in the process and apparatus for producing low work function compound thin films, the following description involves the use of silicon as the semiconductor material and cesium as the alkali metal.

The process consists of laser ablating a silicon (Si) target in a vacuum chamber filled with oxygen. Simultaneously, an alkali metal dispenser is used to evaporate cesium (Cs) toward the Si target. As a result, laser evaporated Si atoms react with oxygen and Cs atoms to produce stable Si/oxygen/alkali metal (Si/Cs/O) compound thin films. These thin film compounds show strong adhesion to flat Si surfaces, but can be deposited on virtually any substrate.

By way of example, the Si target is heated (laser ablated) by a focused beam from a laser, such as an Xe type excimer laser operating at a wavelength of 308 nm, and producing pulses of 20 ns with an energy fluence of 0.5 J/pulse, so as to heat the silicon target to a temperature of about 2500° C. to evaporate atoms therefrom. The wavelength may range from infrared (>750 nm) to ultraviolet (<400 nm), and the energy fluence may be in the range of 0.2–5 J/pulse. The alkali metal dispenser is heated by an electrical power supply so as to heat the cesium to a temperature of about 1000° C. for evaporating the cesium atoms. The oxygen background gas is maintained at a fixed pressure in the range of $7 \times 10^{-4}$ Torr to $10^{-3}$ Torr. In place of the Si target, any other semiconductor such as Ge, GaAr, SiC material may be laser ablated; and any alkali metals may be used in place of cesium, such as rubidium, potassium, lithium, terbium, sodium, francium, etc., depending on the desired end composition of the low work function compound films. Thus, thin film compounds composed of a semiconductor/alkali metal/oxide can be produced. It is understood that work functions of the compound thin films can be varied by changing the Si/Cs/O ratio, for example. If the Si/Cs/O ratio was 1/0.5/0.8, a work function of 1.8 eV is produced; but changing to a ratio of 1/0.15/0.6, a work function of 3.5 eV results. The ratio of the components of the compound thin films is changed by the laser power density, the temperature of the Cs source, and the oxygen background pressure.

Referring now to the embodiment of the apparatus illustrated in FIG. 1 and the process carried out by the apparatus, the apparatus basically comprises a synthesis vessel (vacuum chamber) 10, a silicon target 11 located within vessel 10, a laser 12 directing a focused laser beam 13 onto target 11, an alkali metal evaporation boat or dispenser 14, a collection substrate 15, and an oxygen supply 16 connected to direct oxygen into the vessel 10. The vessel 10 is oxygen filled, as indicated at 17, the laser beam 13 heats and ablates the silicon target 11, as indicated by arrows 18, to produce silicon atoms indicated at 18', and the dispenser 14 heats and evaporates cesium contained therein, as indicated by arrows 19, to produce cesium atoms indicated at 19'. The laser evaporated Si atoms 18' react with the oxygen 17 and the Cs atoms 19' to produce a stable Si/Cs/O thin film on the surface of substrate 15, as indicated at 20. The compound thin film 20 may vary in thickness from a few angstroms to thousands of nanometers, depending on the application for which it is intended. For example, to form a compound thin film having a thickness of 10 nm, a deposition time of 5 seconds with a Xe excimer laser (308 nm, 20 ns pulse width) operating at 3 Hz. In this case, the target-substrate distance is about 30 cm, and the oxygen background pressure is the $10^{-3}$ Torr range.

By changing the rate of silicon atom ablation (evaporation), the rate of cesium atom evaporation and the flow of oxygen, the composition of the compound thin film 20 can be varied, thus changing the work function of the thin film 20. To produce a Si/Cs/O thin film having 43% Si, 22% Cs, and 35% O, the Si target 11 is heated by laser ablation to a temperature of about 2500° C. to produce Si atoms at a rate of $10^{21}$ atoms/cm²/sec. at 20 Torr ( in the region nearby to the laser-Si target interaction spot; the cesium is heated to an evaporation temperature of about 1000° C. to produce Cs atoms at a rate of $10^{16}$ atoms/sec. over a 5 mm long opening slit on the dispenser; and the oxygen background gas is maintained at a fixed pressure in the range from $7 \times 10^{-4}$ Torr to $10^{-3}$ Torr. The alkali metal thermal evaporation may produce atoms at a rate of $10^{14}$ to $10^{17}$ atoms/second.

A patterned flat cathode can be fabricated using the process of the invention by using conventional photo-resist techniques. After deposition, the photo-mask can be washed away with acetone, for example. By coupling a patterned cathode with an anode covered with a layer or film of phosphor, one can selectively bias individual flat cathode elements to extract electrons, which are then accelerated toward the phosphor to obtain an active display. Such diode displays are intrinsically easier to manufacture and offer a real possibility for economic field emission displays.

Figure 2:
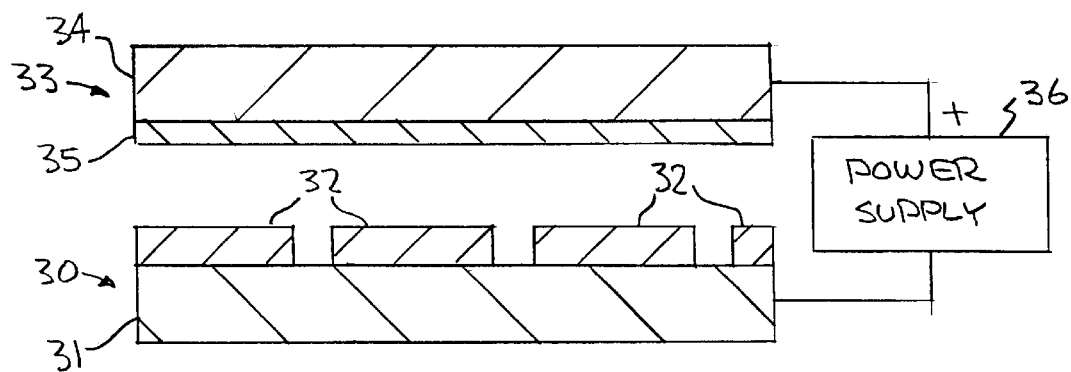
FIG. 2 illustrates an arrangement using a patterned compound thin film as a cathode coupled with an anode covered with phosphor for use in an active display.

FIG. 2 illustrates an embodiment of a patterned flat cathode utilizing a patterned low work function compound thin film, deposited on a substrate, as described above, for a diode type display. As shown in FIG. 2, the cathode comprises a baseplate 30 composed of a substrate 31 and patterned Si/Cs/O thin films 32, and the anode comprises a faceplate 33 composed of a substrate 34 covered with a phosphor layer 35. The baseplate 30 and faceplate 33 are operatively connected to a power supply 36, and, for example, by applying a positive bias to the faceplate 33, electrons can easily be extracted from the compound thin films 32 and illumination on the phosphor layer 35 obtained.

It has thus been shown that the present invention provides a process and apparatus for the generation of low work function, stable compound thin films using simultaneous laser ablation and thermal evaporation of a semiconductor material and an alkali metal into an oxygen environment. While the example described and illustrated produced a Si/Cs/O thin film, other compounds using different ablated and evaporated materials into an oxygen environment can be produced. Also, it has been shown that the work function of the thus produced thin films can be varied by changing the ratio of components of the compound. It has also been shown that patterned low work function compound thin films can be generated by the invention, which can be used as a patterned flat cathode for applications such as solar cells, field emission flat panel displays, electron guns, and cold cathode electron guns.

While a particular deposition apparatus and sequence of operational steps, along with specific materials, parameters, temperatures, etc., have been set forth or illustrated to exemplify and teach the principles of the invention, such are not intended to be limiting. Modifications and changes may become apparent to those skilled in the art, and it is intended that the invention be limited only by the scope of the appended claims.

The invention is claimed is:

1. A process for producing low work function, stable compound thin films on a substrate, comprising:
   providing a substrate,
   generating in an oxygen environment atoms of a semiconductor material by laser ablation; and
   simultaneously generating atoms of an alkali metal by thermal evaporation whereby the atoms react with the oxygen and form a thin compound film on the substrate.

2. The process of claim 1, additionally including providing the oxygen environment in a chamber.

3. The process of claim 1, additionally including providing a laser capable of producing a beam of laser energy having a wave length in the range of <400 nm to >750 nm and energy fluence of 0.2 J/pulse to 5.0 J/pulse for laser ablation of the semiconductor material.

4. The process of claim 1, additionally including providing a dispenser capable of thermal evaporation of the alkali metal to produce atoms at a rate of $10^{14}$ to $10^{17}$ atoms/second.

5. The process of claim 1, additionally including providing the semiconductor material from a group of materials consisting of Si, Ge, GaAr, and SiC.

6. The process of claim 1, additionally including providing the alkali metal from a group consisting of Cs, K, Rb, Li, Na, Fr and Lb.

7. The process of claim 1, wherein the semiconductor material is silicon and wherein the alkali metal is cesium.

8. The process of claim 7, wherein the compound thin film is deposited on the substrate composed of silicon and the film is stable up to about 500° C.

9. The process of claim 1, additionally including varying the work function of the compound thin film by changing the semiconductor material/alkali metal/oxygen ratio.

* * * * *